US011272619B2

United States Patent
Darmawikarta et al.

(10) Patent No.: US 11,272,619 B2
(45) Date of Patent: Mar. 8, 2022

(54) APPARATUS WITH EMBEDDED FINE LINE SPACE IN A CAVITY, AND A METHOD FOR FORMING THE SAME

(71) Applicant: INTEL CORPORATION, Santa Clara, CA (US)

(72) Inventors: Kristof Darmawikarta, Chandler, AZ (US); Robert A. May, Chandler, AZ (US); Yikang Deng, Chandler, AZ (US); Ji Yong Park, Chandler, AZ (US); Maroun D. Moussallem, Chandler, AZ (US); Amruthavalli P. Alur, Tempe, AZ (US); Sri Ranga Sai Boyapati, Chandler, AZ (US); Lilia May, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 548 days.

(21) Appl. No.: 16/321,420

(22) PCT Filed: Sep. 2, 2016

(86) PCT No.: PCT/US2016/050268
§ 371 (c)(1),
(2) Date: Jan. 28, 2019

(87) PCT Pub. No.: WO2018/044326
PCT Pub. Date: Mar. 8, 2018

(65) Prior Publication Data
US 2021/0307172 A1    Sep. 30, 2021

(51) Int. Cl.
*H05K 1/18* (2006.01)
*H05K 3/42* (2006.01)
(Continued)

(52) U.S. Cl.
CPC .............. *H05K 1/183* (2013.01); *H05K 1/116* (2013.01); *H05K 3/429* (2013.01); *H05K 3/4697* (2013.01);
(Continued)

(58) Field of Classification Search
CPC ........ H05K 1/183; H05K 1/186; H05K 3/429; H01L 21/60; H01L 21/4857;
(Continued)

(56) References Cited

U.S. PATENT DOCUMENTS 6,404,052 B1   6/2002  Kurita et al.
8,729,474 B1 *  5/2014  Kurth ................ H01L 27/14607
                                                      250/338.4
(Continued)

FOREIGN PATENT DOCUMENTS

KR      10-0888195     3/2009
KR    10-20160091050   8/2016

OTHER PUBLICATIONS

International Search Report and Written Opinion for International Patent Application No. PCT/US2016/050268, dated Apr. 28, 2017.
(Continued)

*Primary Examiner* — Xiaoliang Chen
(74) *Attorney, Agent, or Firm* — Essential Patents Group, LLP.

(57) ABSTRACT

An apparatus is provided which comprises: a cavity made in a substrate of a printed circuit board (PCB); a plurality of solder balls embedded in the cavity; and a horizontal trace within the substrate, wherein the horizontal trace is partially directly under the plurality of solder balls and is coupled to the plurality of solder balls and another trace or via in the substrate such that a substrate region under the plurality of solder balls is independent of a stop layer under the cavity.

11 Claims, 14 Drawing Sheets

(51) Int. Cl.
*H01L 21/60* (2006.01)
*H01L 27/146* (2006.01)
*G01J 5/20* (2006.01)
*H05K 1/11* (2006.01)
*H05K 3/46* (2006.01)

(52) U.S. Cl.
CPC .............. *H05K 2201/09227* (2013.01); *H05K 2201/10159* (2013.01); *H05K 2201/10212* (2013.01); *H05K 2203/041* (2013.01)

(58) Field of Classification Search
CPC .............. H01L 23/5389; H01L 27/1462; H01L 27/14636; G01J 5/024
USPC ........ 174/260, 338.4; 250/122, 349; 438/54, 438/107; 257/467
See application file for complete search history.

(56) References Cited

U.S. PATENT DOCUMENTS

| | | |
|---|---|---|
| 2007/0025092 A1 | 2/2007 | Lee et al. |
| 2009/0042336 A1* | 2/2009 | Paik .................... H01L 21/4857 438/107 |
| 2011/0194265 A1 | 8/2011 | Su et al. |
| 2015/0247758 A1* | 9/2015 | Kurth .................... G01J 5/024 250/349 |
| 2015/0311246 A1* | 10/2015 | Kurth .................. H01L 27/1462 257/467 |
| 2016/0219712 A1 | 7/2016 | Ko et al. |

OTHER PUBLICATIONS

International Preliminary Report on Patentability for PCT Application No. PCT/US16/50268, dated Mar. 14, 2019.

* cited by examiner

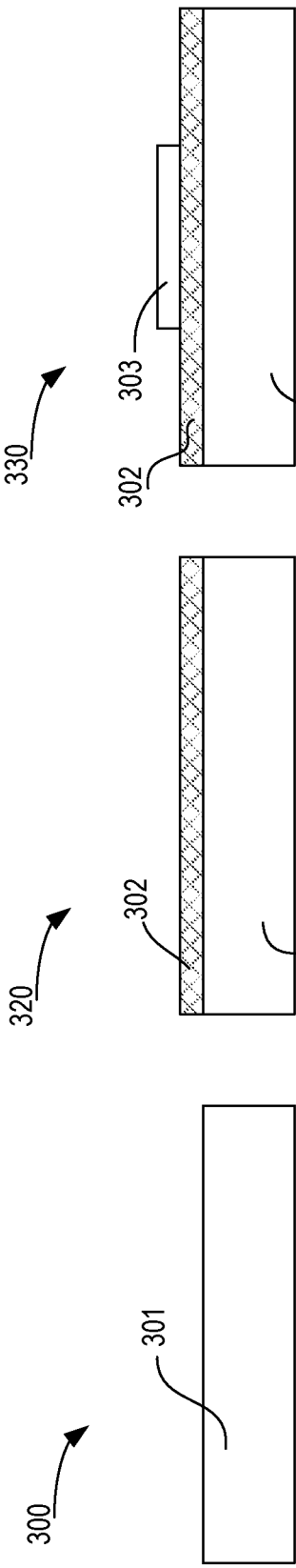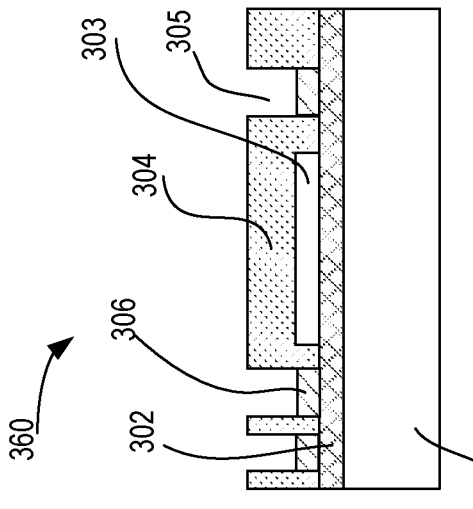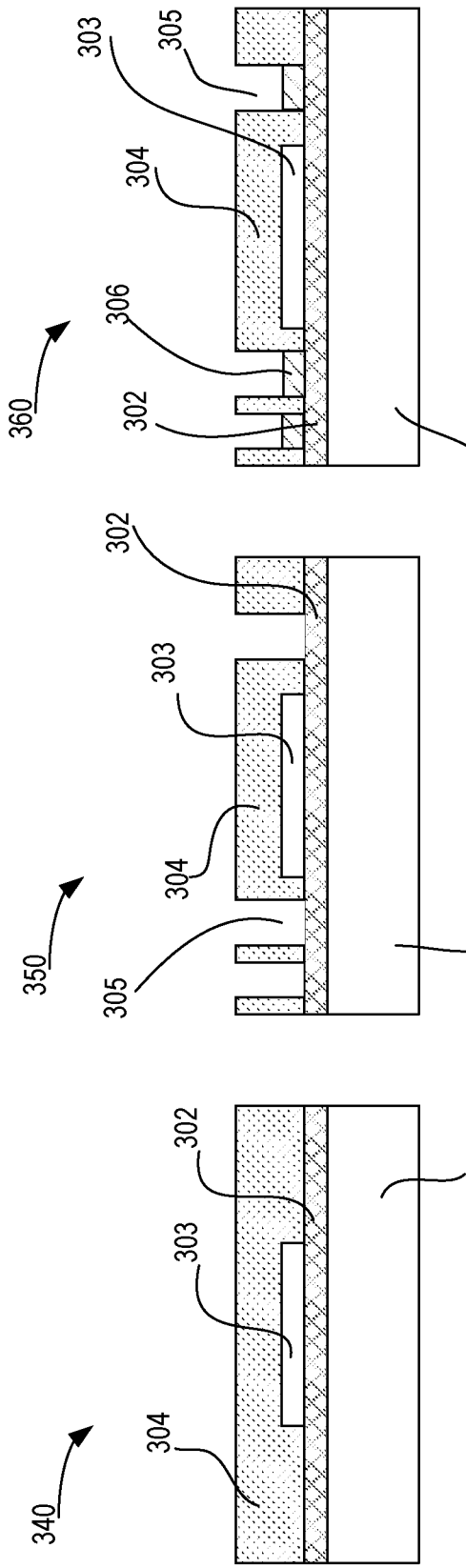

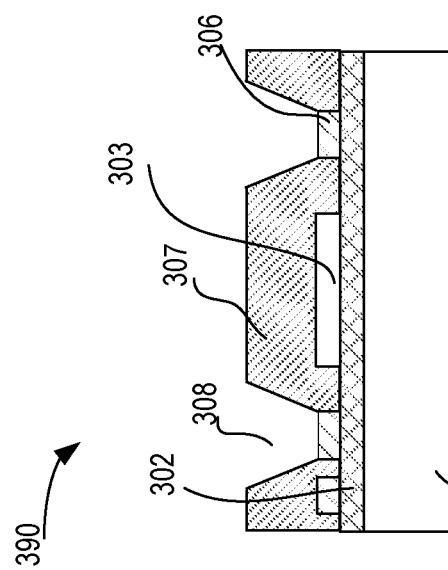
Fig. 3G
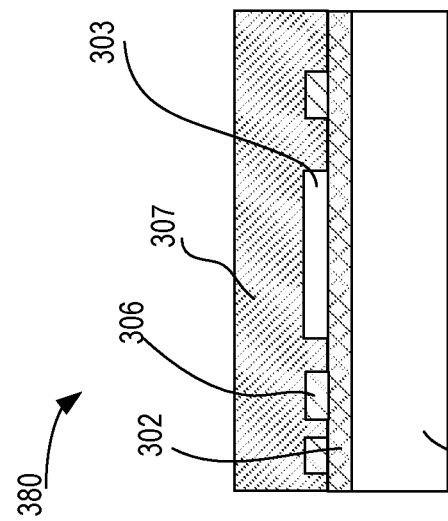
Fig. 3H
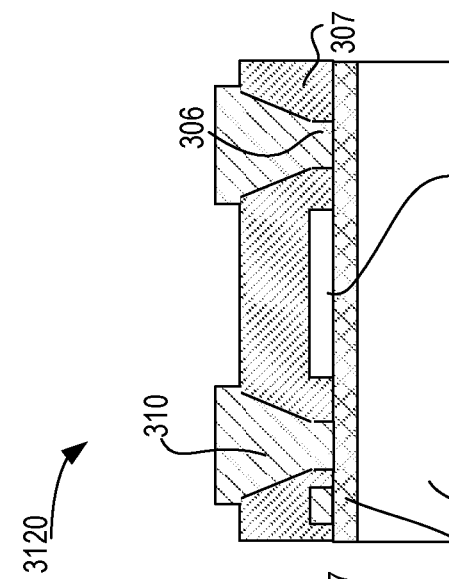
Fig. 3I
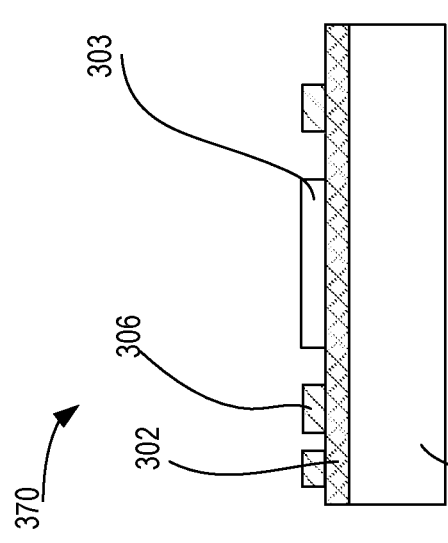
Fig. 3J
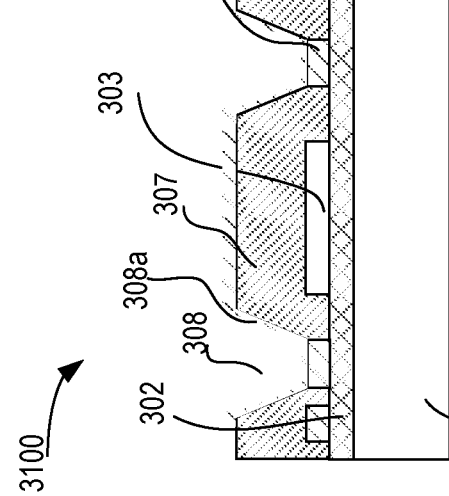
Fig. 3K
Fig. 3L

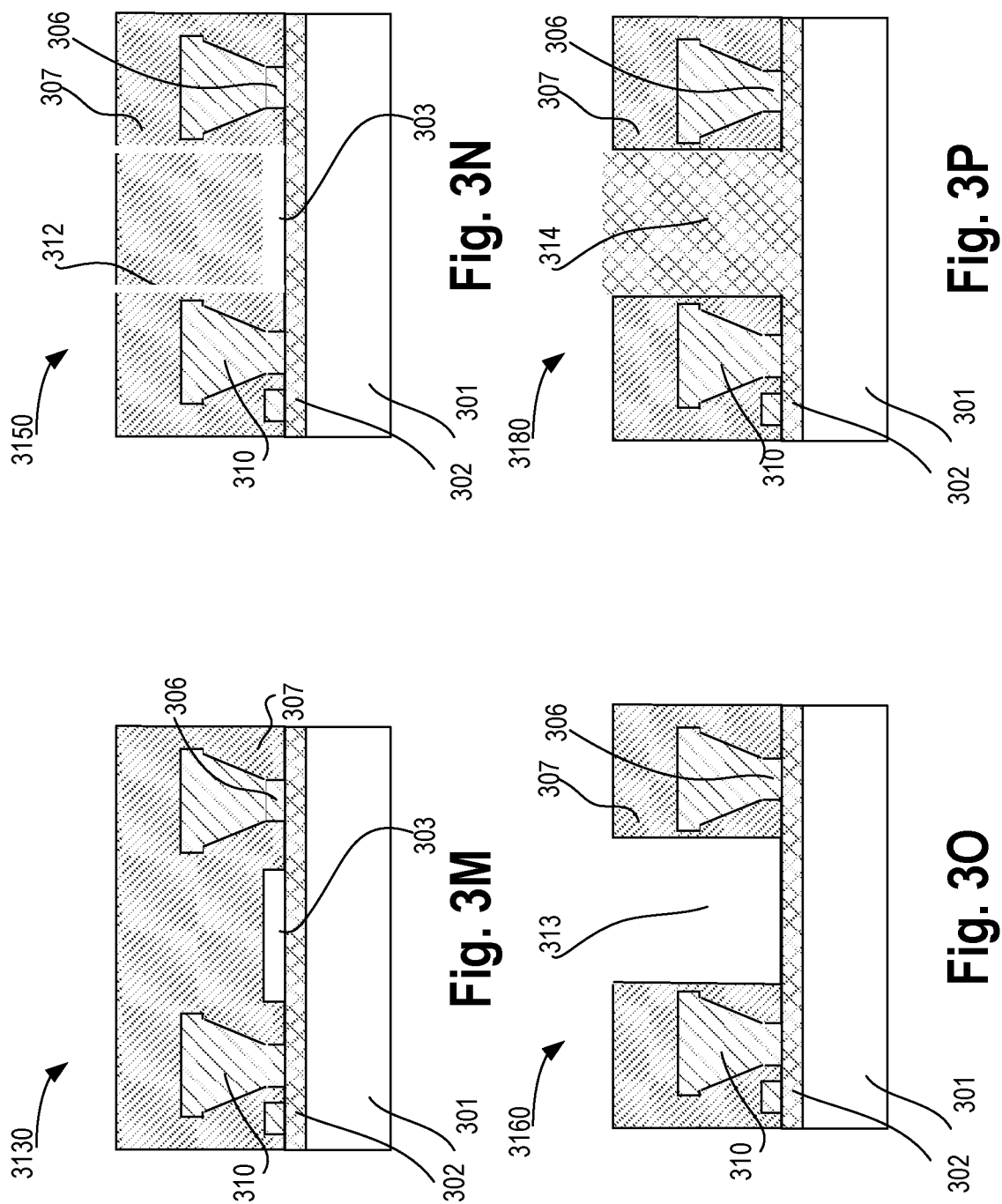

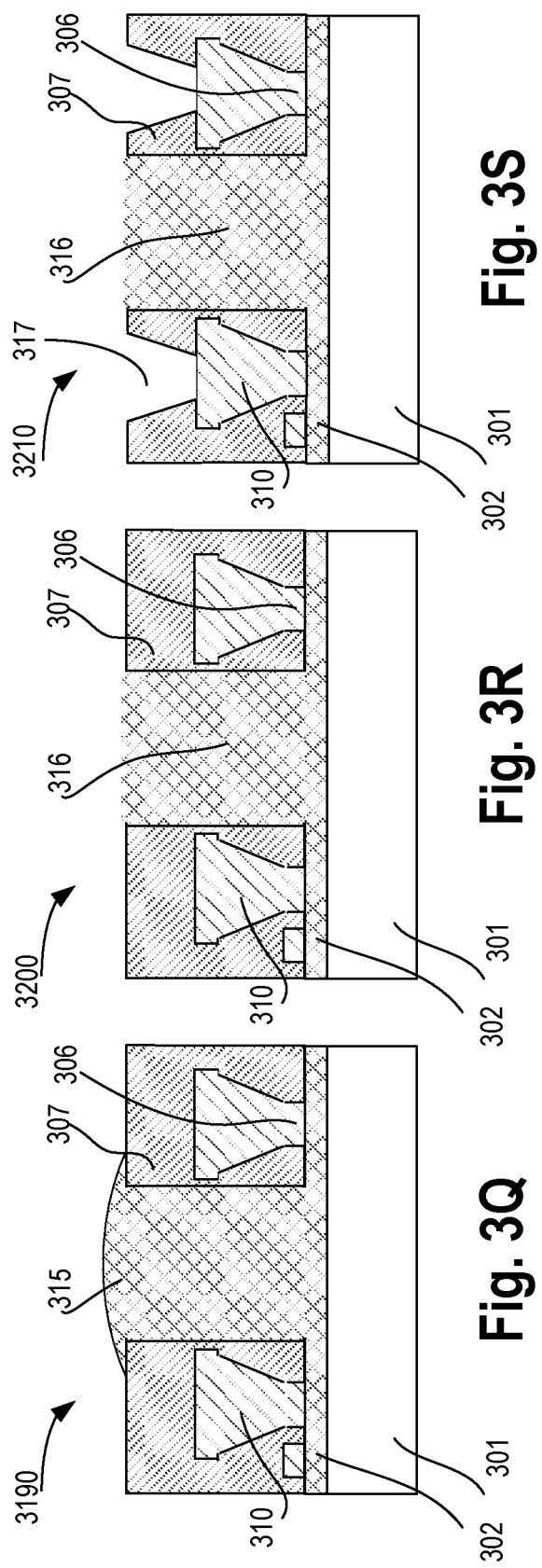

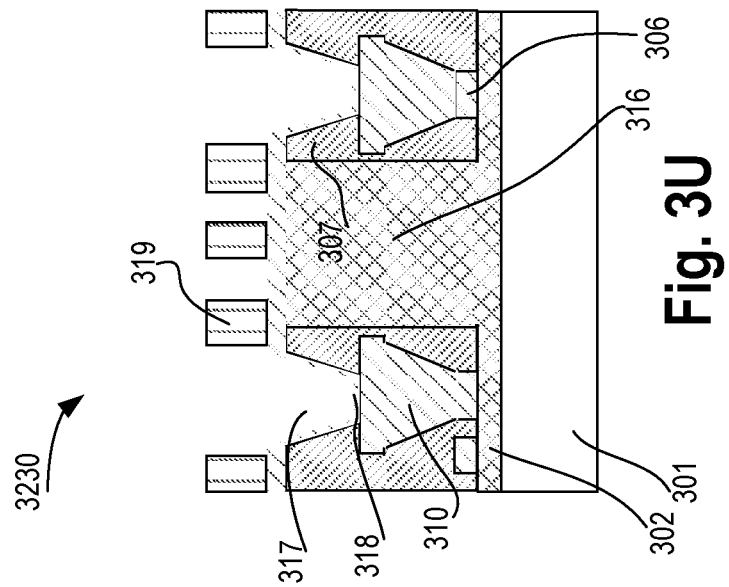
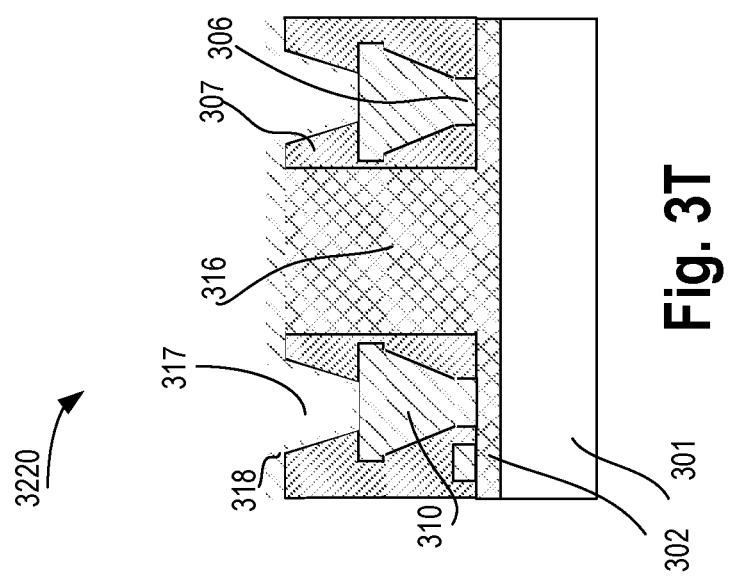
Fig. 3U
Fig. 3T

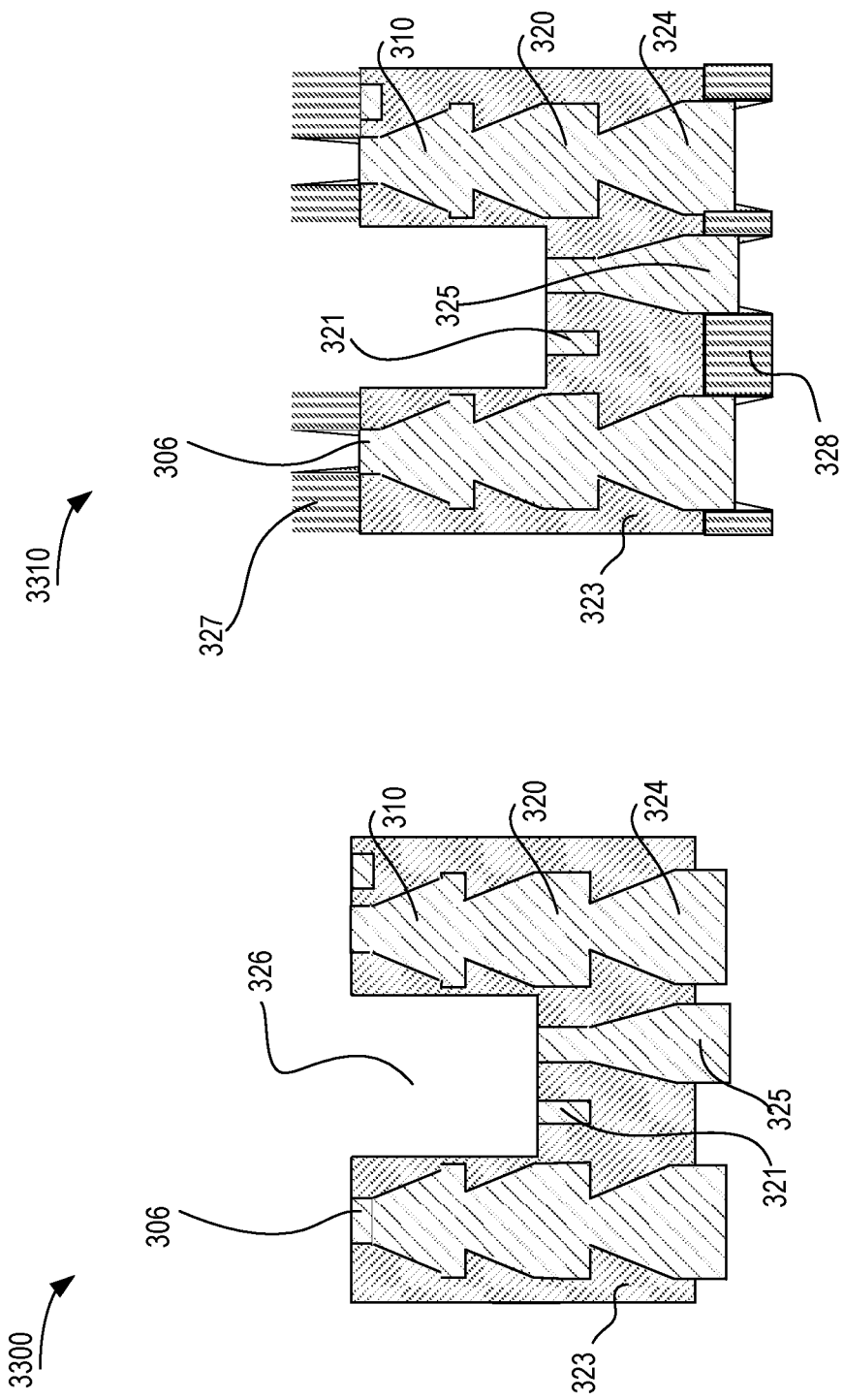

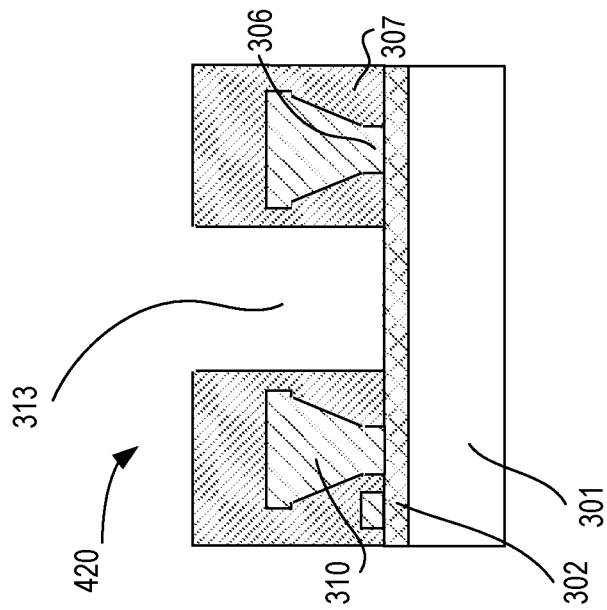
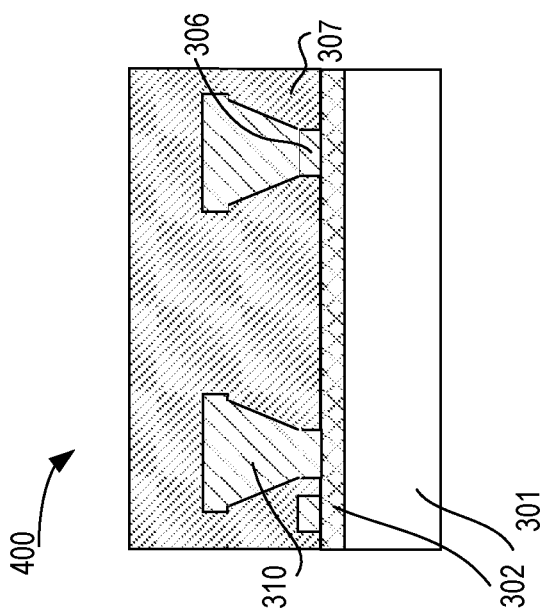
Fig. 4A
Fig. 4B

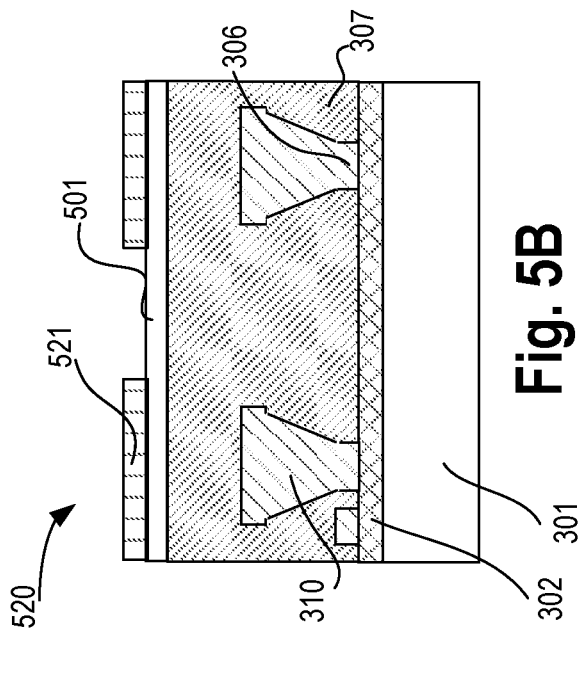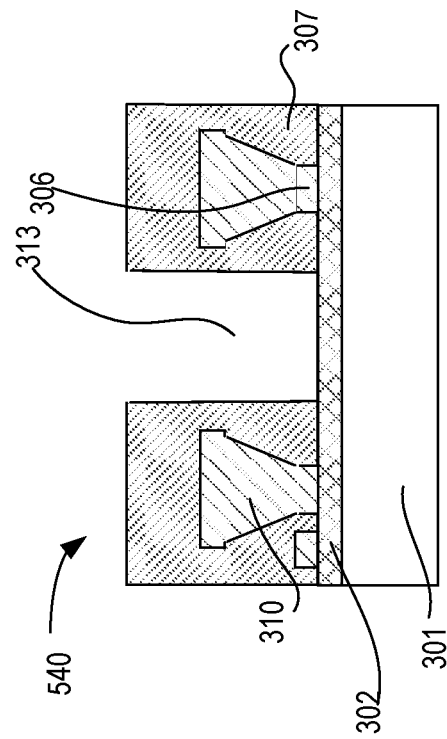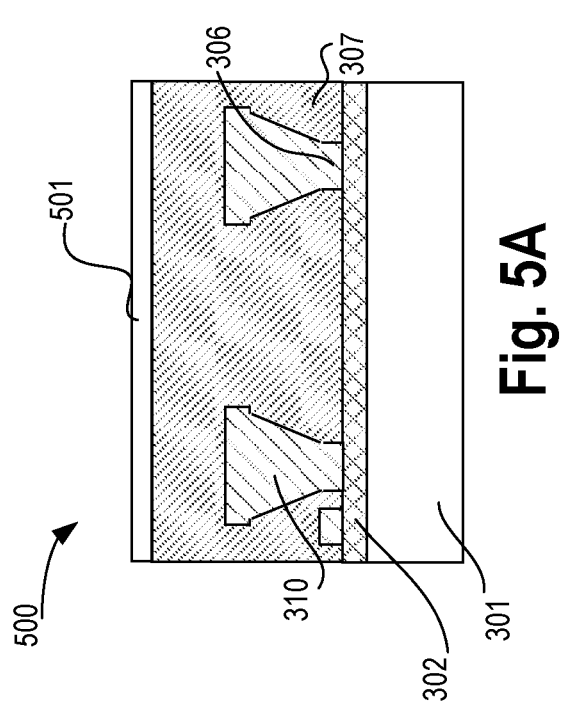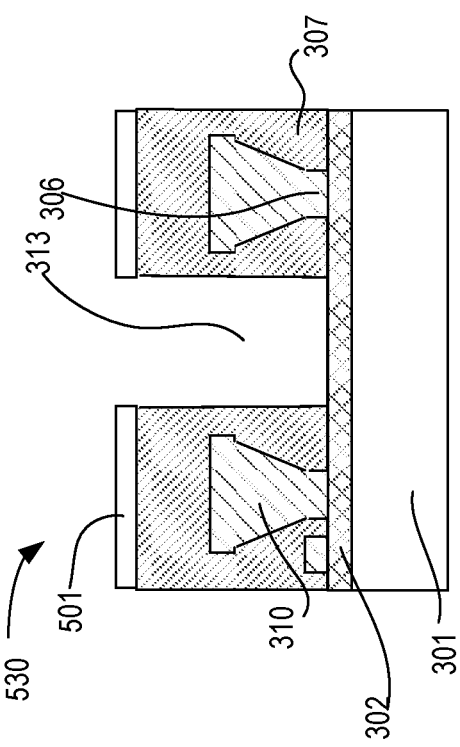
Fig. 5A
Fig. 5B
Fig. 5C
Fig. 5D

APPARATUS WITH EMBEDDED FINE LINE SPACE IN A CAVITY, AND A METHOD FOR FORMING THE SAME

CLAIM OF PRIORITY

This Application is a National Stage Entry of, and claims priority to, PCT Application No. PCT/US16/50268, filed on Sep. 2, 2016 and titled "AN APPARATUS WITH EMBEDDED FINE LINE SPACE IN A CAVITY, AND A METHOD FOR FORMING THE SAME", which is incorporated by reference in its entirety for all purposes.

BACKGROUND

Stacked package architectures provide for excellent integration of computational, sensing and communications components into the smallest possible footprint. However, these stacked packages (which are typically targeted at compact devices such as cell phones) quickly run into z-height limitations. Another limitation of the state-of-the-art PoP (package-on-package) architecture is the scaling of the PoP interconnect pitch. To provide enough standoff height for the die thickness, the solder ball used for PoP interconnect needs to be larger than a certain size, which effectively limits the feasible PoP pitch.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 4A-B illustrate cross-sectional views of a fabrication process of embedding fine line space in a cavity, according to some embodiments of the disclosure.

FIGS. 5A-D illustrate cross-sectional views of a fabrication process of embedding fine line space in a cavity, according to some embodiments of the disclosure.

DETAILED DESCRIPTION

Figure 1:
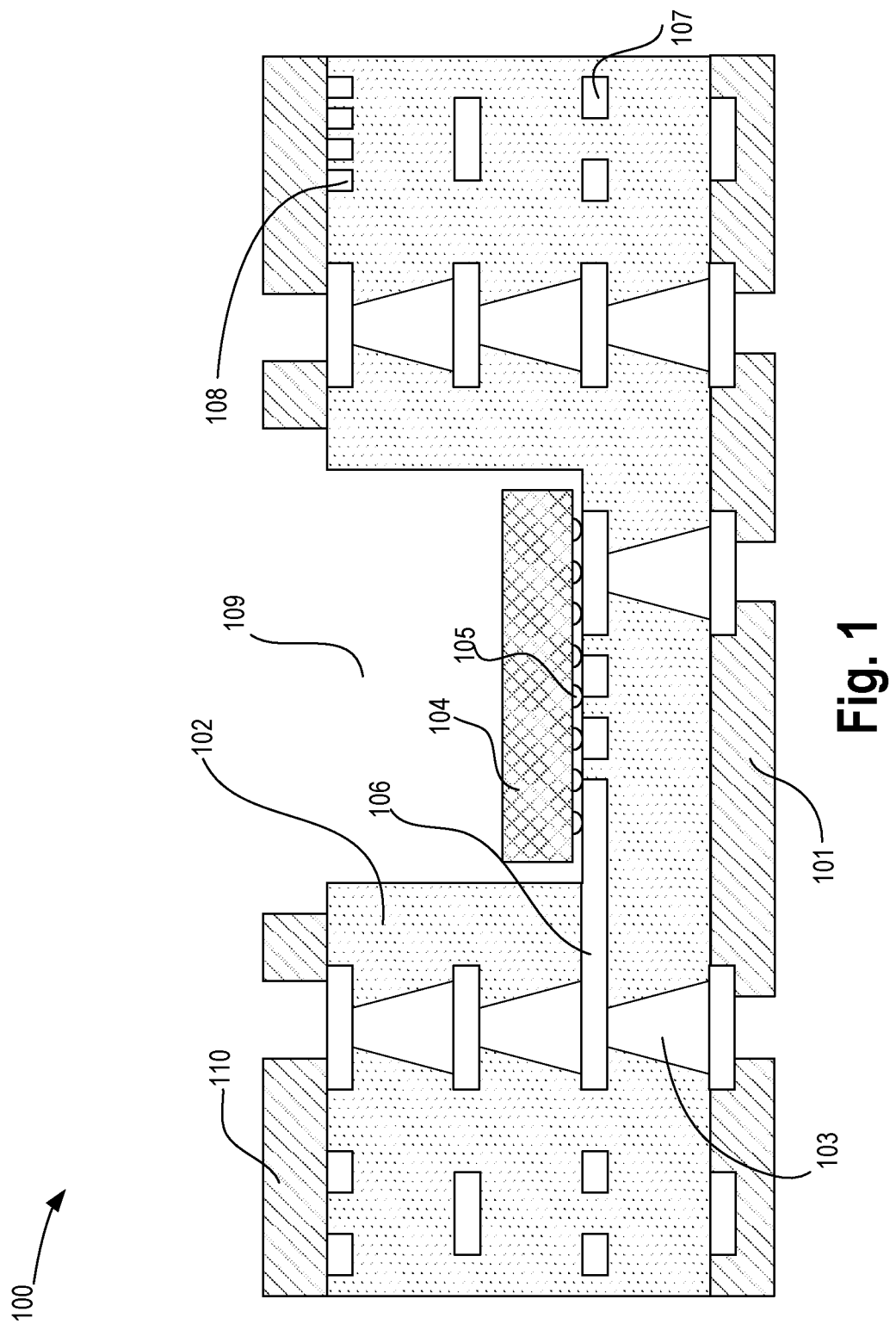
FIG. 1 illustrates a cross-sectional view of a packaging system with a die attached inside a cavity, where the packaging system allows for horizontal escape routing traces and vertical vias to/from the cavity, in accordance with some embodiments of the disclosure.

One way to reduce z-height (e.g., height in the z-direction of an x-y-z plane) and to further scale down the PoP interconnect pitch is to place some of the components in a cavity or embed them entirely inside a substrate. However, existing cavity fabrication process flows using laser trimming and skiving possess several drawbacks. For example, existing cavity fabrication process requires a laser stop layer to prevent laser damage to the underlying substrate layers. The presence of this stop layer means that fan-out is not feasible from inside the cavity to outside the cavity on the first layer below the die. Existing cavity fabrication process require a large keep-out zone around the cavity due to cavity drilling accuracy limits. In some examples, a release layer is typically used to assist with removal of cavity material. This release layer leaves behind residue which creates undesirable issues with subsequent processing steps.

Some embodiments describe a process fabrication flow using laser skiving and/or trimming in a coreless architecture, to form a cavity. This solution addresses the issues above affording routing directly through the cavity and eliminates the stop layer in the final product, in accordance with some embodiments. In some embodiments, very fine routing is achieved on the First Level Interconnect (FLI) layer due to use of embedded traces (ETS) on that layer.

In some embodiments, a sacrificial metal layer (e.g., Ni, Sn, etc.) is plated in a temporary cavity above a carrier layer. In some embodiments, after grinding the top of this sacrificial metal layer, surrounding dielectric are used as the base for the next layer. This layer will eventually be the bottom of the cavity, according to some embodiments. In some embodiments, after detachment of the carrier layer, the sacrificial metal layer is etched out to create the real cavity with traces embedded in the bottom of the cavity. The process flow affords fine routings (e.g., 9/12 µm line space (L/S) routing for semi-additive process) inside the cavity, embedded traces (e.g., as fine as 2/2 µm L/S) on the first layer interconnect (FLI) layer side, and tighter cavity dimension design rules due to the absence of laser stop layer. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "from," "back," "top," "bottom," "over," "under," and the like in the description and in the claims, if any, are used for descriptive purposes and not necessarily for describing permanent relative positions.

FIG. 1 illustrates cross-sectional view 100 of a packaging system with a die attached inside a cavity, where the packaging system allows for horizontal escape routing traces and vertical vias to/from the cavity, in accordance with some embodiments of the disclosure.

The packaging system here comprises a base layer 101 (e.g., a solder resist layer), dielectric 102 (e.g., epoxy), vertical vias 103, processor die 104, solder balls 105, horizontal trace 106 extending under the processor die (or any device in cavity 109) and coupling to a via, horizontal traces 107 extending inside the page (e.g., orthogonal to the horizontal trace 106), first layer interconnect (FLI) 108, cavity 109 embedded in the substrate or dielectric 102, and a top layer 110 (e.g., a solder resist layer). Cavity 109 is formed according to the processes described with reference to FIGS. 3-5, in accordance with various embodiments. Any suitable process or means can be used for coupling die 104 to traces/vias 106 and 103. Here the term "traces" and "vias" are interchangeably used. In some embodiments, cavity 109 affords escape routing traces (e.g., horizontal trace 106) and supports standard vertical trace connections (e.g., vias 103) to solder balls 105 in cavity 109. For example, horizontal trace 106 may follow semi-adaptive process (SAP) design rules. The horizontal traces may be embedded traces, in accordance with some embodiments. For example, some horizontal traces may be embedded in cavity 109, in accordance with some embodiments. In various embodiments, there are no keep-out zones around cavity 109. As such, the device (active or passive) embedded in cavity 109 can be directly connected to traces under cavity 109. In some embodiments, FLI layer 108 provides denser routing benefit.

Figure 2:
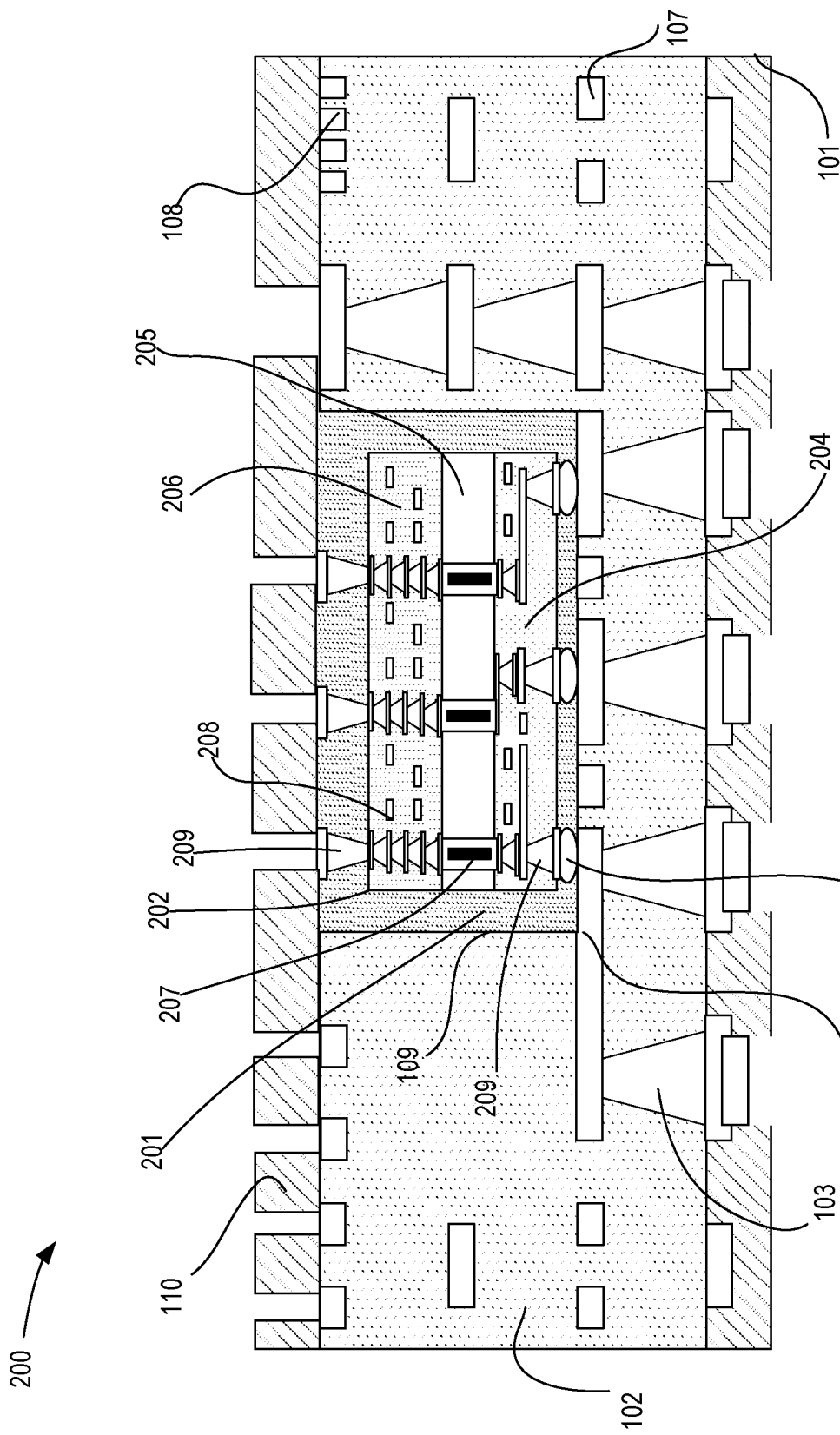
FIG. 2 illustrates a cross-sectional view of a packaging system with an embedded patch with finer pitch, where the packaging system allows for horizontal escape routing traces and vertical vias to/from the embedded patch, in accordance with some embodiments of the disclosure.

FIG. 2 illustrates cross-sectional view 200 of a packaging system with an embedded patch with finer pitch, where the packaging system allows for horizontal escape routing traces and vertical vias to/from the embedded patch, in accordance with some embodiments of the disclosure. It is pointed out that those elements of FIG. 2 having the same reference numbers (or names) as the elements of any other figure can operate or function in any manner similar to that described, but are not limited to such.

In some embodiments, instead of placing a processor die in cavity 109, a patch 202 is embedded in cavity 109. Here, the term "patch" may refer to any material or devices in a cavity that may have traces with finer pitches than traces outside the cavity. In some embodiments, a material is encased around patch 202 to provide rigidity to patch 202 (e.g., it keeps patch 202 in place). In some embodiments, the material is formed of dielectric. In some embodiments, patch 202 is coupled to horizontal trace 106 and vertical vias 103 through solder balls 203/105. In some embodiments, patch 202 includes three layers—204, 205, and 206, where layer 205 is sandwiched by layers 204 and 206. In some embodiments, layer 205 (e.g., glass) provides rigidity to patch 202. In some embodiments, the pitch size of the horizontal and vertical traces (e.g., 208, 209) of patch 202 are much finer (e.g., smaller) than the pitch size of traces outside of patch 202 (e.g., traces 103, 106, and 107). In some embodiments, layer 204 is coupled to layer 206 through cores 207 which are holes that are drilled and filled with a conducting material (e.g., Copper (Cu)). In some embodiments, cores 207 behave as pillars between layers 204 and 206 to provide structural integrity to patch 202. In some embodiments, layer 206 is coupled to traces on motherboard (e.g., printed circuit board (PCB)) through vias 209.

The fabrication process flow of various embodiments can be utilized for embedding actives (e.g., integrated circuit) or passives (e.g., inductors, capacitors, and resistors) for system-in-package (SiP) applications or patches with high density routing for hybrid substrates. The advantage here, for example, is that connections can be made on both the top and bottom sides of the embedded component in cavity 109 and routing beneath cavity 109 allows for finer pitches to be broken out in fewer layers. FIG. 2 illustrates a hybrid substrate where a small patch 202 with fine pitch capability is embedded inside a lower cost PCB with much looser design rules. In this example, the patch cavity is filled in with an under-fill or dielectric 201 and the excess is ground down. The vias 209 (204/105) are then filled with electroless Ni or Sn, in accordance with some embodiments. This process flow enables routing beneath patch 202 to reduce the number of layers needed for breakout. In some embodiments, ETS (embedded traces) layer on the surface allow for higher I/O (input-output) density components to be assembled to the package.

Figure 3W:
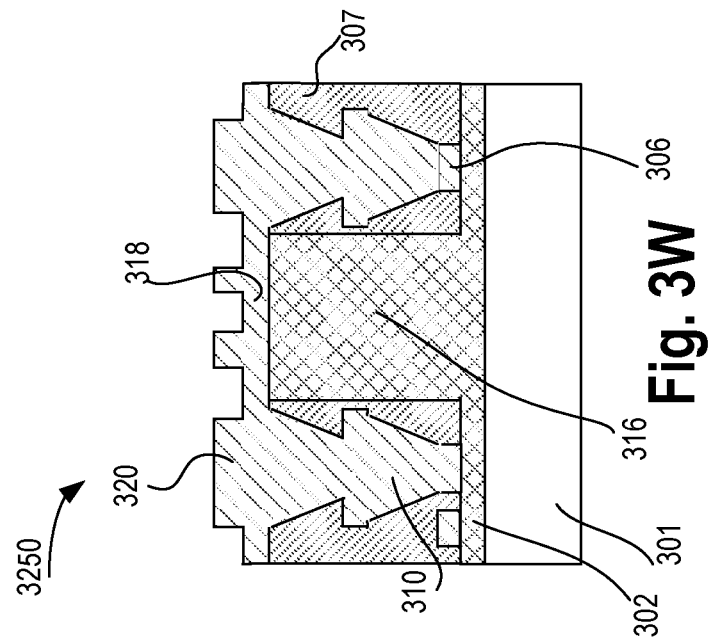
FIGS. 3A-AC illustrate cross-sectional views of a fabrication process of embedding fine line space in a cavity, according to some embodiments of the disclosure.
Figure 3V:
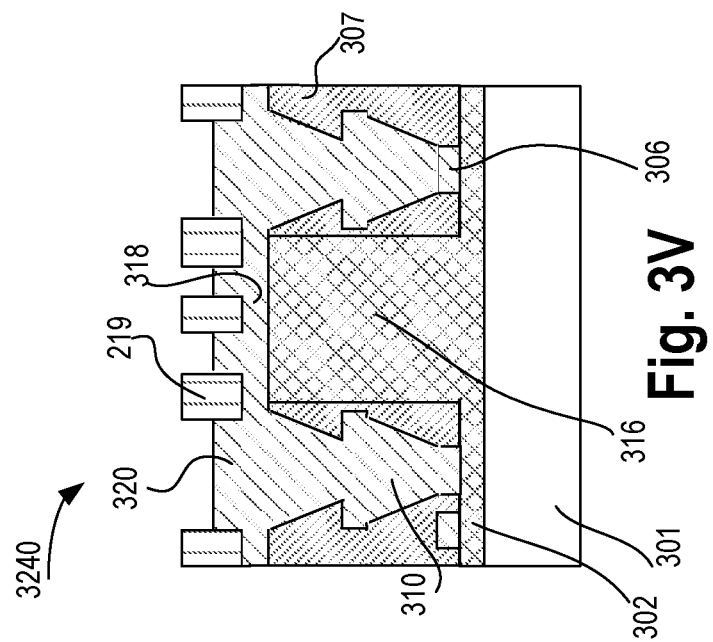
Figure 3Y:
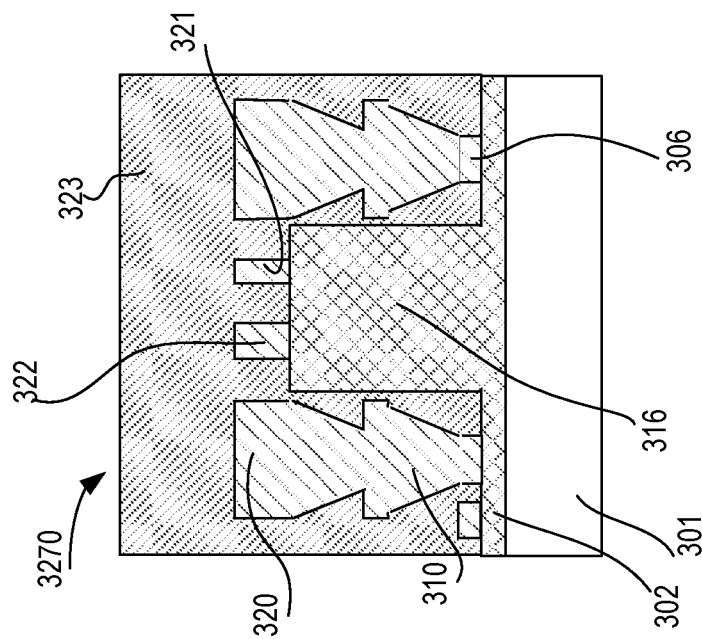
Figure 3X:
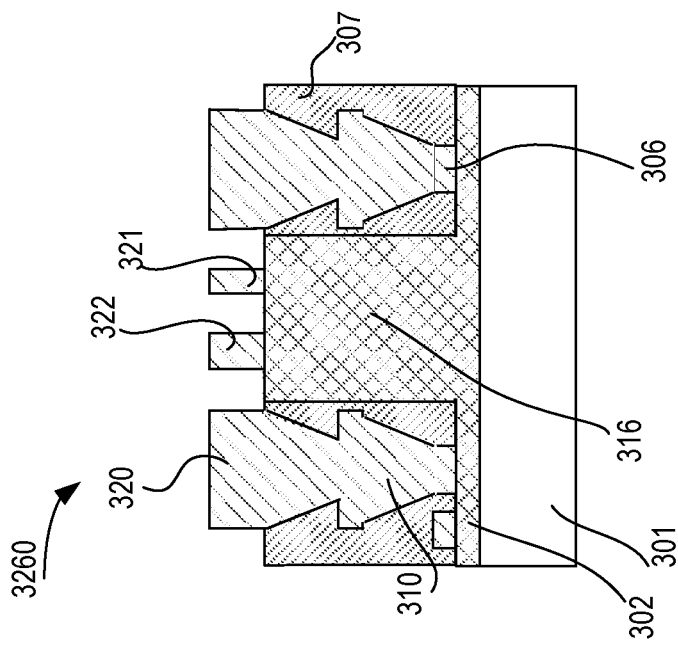
Figure 3A:
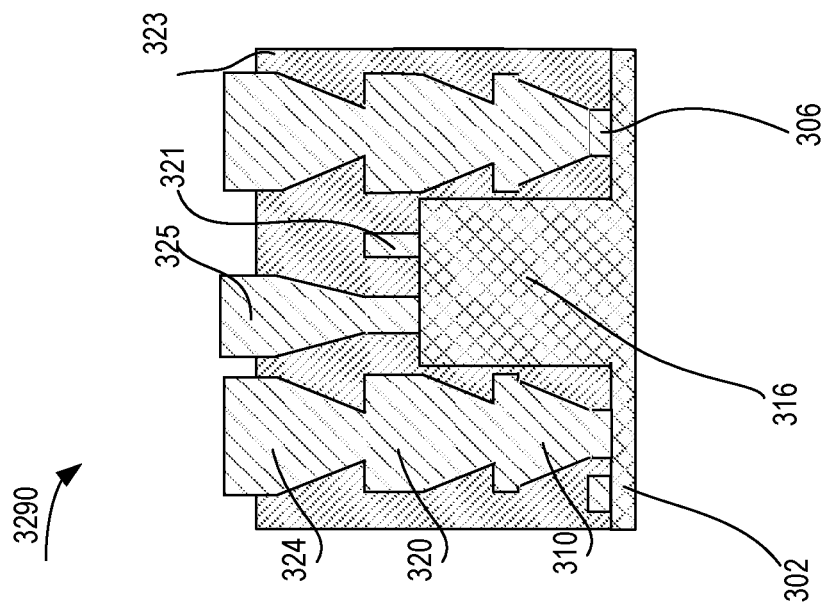

FIGS. 3A-AC illustrate cross-sectional views of a fabrication process of embedding fine line space in a cavity, according to some embodiments of the disclosure. Although the process in the fabrication process with reference to FIGS. 3A-AC are shown in a particular order, the order of the actions can be modified. Thus, the illustrated embodiments can be performed in a different order, and some actions/processes may be performed in parallel. Some of the processes and/or operations of FIGS. 3A-AC are optional in accordance with certain embodiments.

Cross-sectional view 300 of FIG. 3A illustrates carrier layer 301, which may be the base layer for starting the fabrication process. In some embodiments, carrier layer 301 comprises a material selected from a group consisting of: stainless steel, glass, and FR4 prepreg. Any suitable material can be used for forming carrier layer 301. Cross-section view of 320 of FIG. 3B illustrates the deposition of a metal layer 302 with a known high etch selectivity against copper. In some embodiments, metal layer 302 is formed of Ni or Sn which is deposited on carrier layer 301. In other embodiments, other metals with properties similar to Ni and Sn with etch selectivity against copper can be used for metal layer 302. In some embodiments, metal layer 302 is other than copper and forms the seed layer of the embedded trace structure. One reason for using a material with known high etch selectivity against Cu for metal layer 302 is that a Cu embedded trace remains intact during the sacrificial metal etch step.

Cross-sectional view 330 of FIG. 3C illustrates the deposition or printing of release layer 303 on the desired cavity region. In some embodiments, release layer 303 is a temporary material (e.g., an adhesive or similar material). Any suitable material can be used for forming realize layer 303. For example, acrylic based materials, thermoplastic resin, runner compounds, etc. can be used for forming realize layer 303. Cross-sectional view 340 of FIG. 3D illustrates deposition of a photoresist material 304 over metal layer 302 and release layer 303. Any suitable photoresist material can be used for photoresist material 304. For example, dry film or liquid photoresist material may be used for photoresist material 304. Cross-sectional view 350 of FIG. 3E illustrates a view after photoresist material 304 is patterned leaving regions 305 that expose metal layer 302. In some embodiments, photoresist lithography is done on top of metal layer 302 (also referred to as metal foil) and release layer 303 to define an embedded trace FLI. As an example, the process continues to a well-known modified semi-additive process (MSAP) flow often used with Pre-preg (pre-impregnated) materials. Pre-preg materials are composite fibers (e.g., like a weave form) where a matrix material (e.g., epoxy) is present. However, regular SAP flow can be used with Ajinomoto Build-up Film (ABF) material if desired, in accordance with some embodiments. In some embodiments, the photoresist material 304 over release layer 303 is not patterned.

Cross-sectional view 360 of FIG. 3F illustrates a view after Cu electroplating 306 in the patterned regions 305. These pattered regions 305 may be used to form horizontal traces and/or vertical vias. Cross-sectional view 370 of FIG. 3G illustrates a view after photoresist 304 is stripped off Any suitable scheme for removing photoresist may be used. Cross-sectional view 380 of FIG. 3H illustrates a view in which a layer of dielectric 307 is deposited over the Cu electroplated regions 306, metal layer 302, and release layer 303. In some embodiments, dielectric 307 is formed of epoxy. In some embodiments, dielectric 307 is formed of epoxy with some additives. For example, phenolic or phenolic ester may be used as a hardener. From here on, the MSAP or SAP process begins for the next few layers, in accordance with some embodiments.

Cross-sectional view 390 of FIG. 3I illustrates a view in which laser is used to drill holes 308 through dielectric 307 for future vertical vias. FIG. 3J illustrates view 3100 in which metal seed layer 308a is added in the drilled holes 308 and over dielectric 307. In some embodiments, the metal seed layer 308a is made of the same material as material of metal 306. For example, Cu is used as metal seed layer 308a in accordance with some embodiments. Cross-sectional view 3110 of FIG. 3K illustrates a view in which two processing steps are shown. First, a patterned photoresist material 309 is deposited over metal seed layer 308a such that holes 308 are exposed. Any suitable lithography scheme can be used for forming pattered photoresist material 309. Second, Cu is electroplated in holes 308 over the metal seed layer 308a to form vias 310. In some embodiments, the Cu deposited in this step stacks over Cu electroplated in cross-sectional view 360. Cross-sectional view 3120 of FIG. 3L illustrates a view in which photoresist material 309 is removed leaving behind the electroplated Cu. In some embodiments, when photoresist material 309 is etched, any excess metal seed layer 308a is removed under photoresist material 309.

After 'n' number of layers (here two layers are shown as an example for simplicity, but an actual number may depend on the cavity depth requirement), laser is used to trim the material, in accordance with some embodiments. In some embodiments, the printed release layer 303 aids in material removal, thus creating a temporary cavity. In some embodiments, since release layer 303 is at the bottom of the temporary cavity, residue and damage are of no concern, unlike the standard cavity process.

Cross-sectional view 3130 of FIG. 3M illustrates a view in which more dielectric 307 is deposited to continue with the next layer formation. Cross-sectional view 3150 of FIG. 3N illustrates the process of making a temporary cavity. The term "temporary cavity" is used to indicate that a final cavity is to be formed. This temporary cavity is first formed, then filled with Ni or Sn, and then the Ni or Sn is removed to form a final cavity with traces underneath it and/or embedded in it. In some embodiments, a laser is used to trim sidewalls 312 of the temporary cavity. The metal layer 302 is used as a stop layer for the laser, in accordance with some embodiments. Cross-sectional view 3160 of FIG. 3O illustrates the formation of cavity 313. Here, cavity 313 is a temporary cavity. At this point, dielectric 307 within the boundaries of laser trimmed regions 312 is removed leaving behind a cavity. Cross-sectional view 3180 of FIG. 3P illustrates a view in which the temporary cavity 313 is filled with a material 314 (e.g., metal) having a high etch selectivity against copper. In some embodiments, the temporary cavity is filled with Ni or Sn (e.g., same material as layer 302).

Cross-sectional view 3190 of FIG. 3Q illustrates a view in which the temporary cavity 313 is over-filled with Ni or Sn by electroplating. The over-filled Ni or Sn is illustrated by identifier 315. Cross-sectional view 3200 of FIG. 3R illustrates a view after the over-filled Ni or Sn 315 is grinded to planarize and remove Ni or Sn overburden, thus creating a relatively flat surface on which standard SAP traces can be fabricated, in accordance with some embodiments. This planarized region is used for forming the escape routing (e.g., horizontal trace 106) at the bottom of cavity 313, in accordance with some embodiments.

Here, two different material are being grinded—Ni overfilled in cavity 313, and dielectric material 307 (e.g., polypropylene (PP), epoxy with additives such as ABF, etc.) and the transition between the two materials. By using these materials (e.g., Ni and PP for over-fill 315 and dielectric 307, respectively) and grinding those leaves behind a smooth surface with a smooth transition between the materials. As such, in one example, a surface suitable for SAP patterning is provided even when using an inexpensive and un-optimized grinder, in accordance with some embodiments. Cross-sectional view 3210 of FIG. 3S illustrates a view after holes 317 are drilled for future via stack. Holes 317 may be used for vertical vias that are to be stacked over via 310, for example.

Cross-sectional view 3220 of FIG. 3T illustrates a view after a seed metal layer 318 is deposited over holes 317 and along the top service as shown. Cross-sectional view 3230 of FIG. 3U illustrates a view after patterned lithography of a photoresist 319. This process is similar to the one of FIG. 3K. Cross-sectional view 3240 of FIG. 3V illustrates a view after copper is electroplated in holes 317 forming vertical stacked via 320 and other traces (not shown). Cross-sectional view 3250 of FIG. 3W illustrates a view after patterned photoresist 319 is removed or stripped. Cross-sectional view 3260 of FIG. 3X illustrates a view after seed layer 318 is selectively etched to leave horizontal traces 320 and 321, and vertical traces 322. Cross-sectional view 3270 of FIG. Y illustrates a view after more dielectric 323 is deposited over the horizontal traces 320 and 321, and vertical traces 322

Figure 3Z:
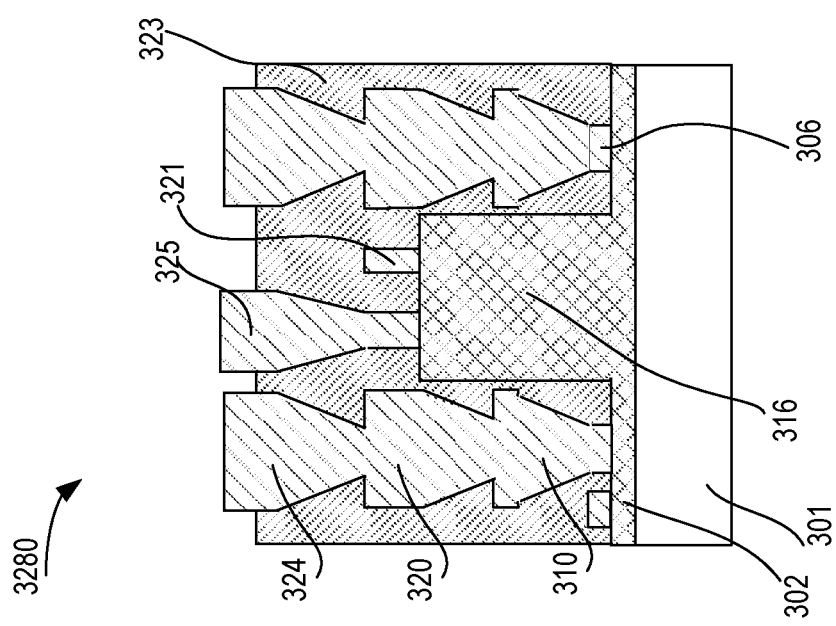

In some embodiments, after SAP plating of the escape traces, the MSAP process (or SAP with ABF, if desired) continues as needed. Cross-sectional view 3280 of FIG. 3Z illustrates a view after more vias 324 and 325 are formed in dielectric 323. Once the required number of layers are completed, substrate or dielectric 323 is detached from carrier region 301 and the Ni is etched out. Cross-sectional view 3290 of FIG. 3AA illustrates a view after carrier region 301 is removed leaving behind Ni (or Sn) 302 and 316.

Cross-sectional view 3300 of FIG. 3AB illustrates a view after Ni or Sn from cavity 326 and layer 302 are etched. This can be done by inversing or flipping the structure shown in FIG. 3AA. In some embodiments, during Ni etch, the detached substrate 323 may be re-attached to another temporary carrier for higher structural rigidity. Existing Ni etch is selective at approximately 10:1 against copper, for example. Hence, a chemistry optimization may be needed in one example. Alternatively, an electroplated multi-layer of Au—Ni (for example using existing wire bond surface finish tool set) can be fabricated at the ETS layer as an etch stop layer. This Au—Ni layer can also serve as the surface finish. In some embodiments, gold (Au) can be in cavity 326 and the surface layer. In some embodiments, the surface layer has Au because the surface may be exposed to etching chemistry for much longer duration while the sacrificial Ni block is being etched. In some embodiments, the substrate 323 can continue to solder resist lamination (327 and 328) and final surface finish as shown by view 3310 of FIG. 3AC.

FIGS. 4A-B illustrate cross-sectional views of a fabrication process of embedding fine line space in a cavity, according to some embodiments of the disclosure. Although the process in the fabrication process with reference to FIGS. 4A-B are shown in a particular order, the order of the actions can be modified. Thus, the illustrated embodiments can be performed in a different order, and some actions/processes may be performed in parallel. Some of the processes and/or operations of FIGS. 4A-B are optional in accordance with certain embodiments.

Cross-sectional view 400 of FIG. 4A illustrates a view after dielectric or substrate 307 is extended over via 310. This view is similar as cross-sectional view 3130 of FIG. 3M, but for no release layer 303. So as not to obscure the embodiments, previous fabricating steps leading to cross-sectional view 400 are not shown. These fabricating steps are similar to those discussed with reference to FIGS. 3A-M except without release layer 303.

FIG. 4B (like FIGS. 3N-O) illustrates a cross-sectional view 420 after the process of making a temporary cavity 313. In some embodiments, a laser is used to trim sidewalls of the cavity. For example, laser skiving is used to make cavity 313. The metal layer 302 is used as a stop layer for the laser, in accordance with some embodiments. In some embodiments, a Desmear step is used to clean the bottom of cavity 313 because release layer 303 is not used. The rest of the process is same as that described with reference to FIGS. 3P-AC.

FIGS. 5A-D illustrate cross-sectional views of a fabrication process of embedding fine line space in a cavity, according to some embodiments of the disclosure. Although the process in the fabrication process with reference to FIGS. 5A-D are shown in a particular order, the order of the actions can be modified. Thus, the illustrated embodiments can be performed in a different order, and some actions/processes may be performed in parallel. Some of the processes and/or operations of FIGS. 5A-D are optional in accordance with certain embodiments. In some embodiments, a plasma etching process is utilized to fabricate the temporary cavity. In some embodiments, a copper foil 501 incoming on the pre-preg can be patterned to form the mask for plasma etching. In some embodiments, when ABF is used, Cu layer 501 can be deposited with sputtering or electro-less deposition.

Cross-sectional view 500 of FIG. 5A illustrates a view after dielectric or substrate 307 is extended over via 310. This view is same as cross-sectional view 3130 of FIG. 3M, but for no release layer 303. In some embodiments, copper foil 501 (e.g., a mask layer) is deposited over dielectric 307. So as not to obscure the embodiments, previous fabricating steps leading to cross-sectional view 500 are not shown. These fabricating steps are similar to those discussed with reference to FIGS. 3A-M except without release layer 303.

Cross-sectional view 520 of FIG. 5B illustrates a view after photoresist 521 is patterned over copper foil 501 such that the pattern identifies the future region of the cavity. Cross-sectional view 530 of FIG. 5C illustrates a view after photoresist 521 is removed or stripped and after the process of making a temporary cavity 313. In some embodiments, a laser is used to trim sidewalls of the cavity. For example, laser skiving is used to make cavity 313. In some embodiments, copper or other metal such as Ti is used as hard mask, and plasma etching is used to form cavity 313. Here, Cu is referred for hard mask because it is practically not etched by the plasma. The plasma can be Fluorine (F) based and/or Oxygen (O) based plasma, in accordance with some embodiments. When plasma is used, laser may not be needed in accordance with some examples. Cross-sectional view 540 of FIG. 5D illustrates a view after removing patterned Cu foil 501. In some embodiments, a desmear step is used to clean the bottom of cavity 313 because release layer 303 is not used. In some embodiments, instead of using desmear step, etching step is used to remove the metal hard mask. The rest of the process is same as that described with reference to FIGS. 3P-AC.

While various embodiments are described with having horizontal and vertical traces made from Cu. Other conducting materials (e.g., Al, Au, alloys of Cu, Al, and Au etc.) can be used instead of just Cu in various fabricating processes described here.

Figure 6:
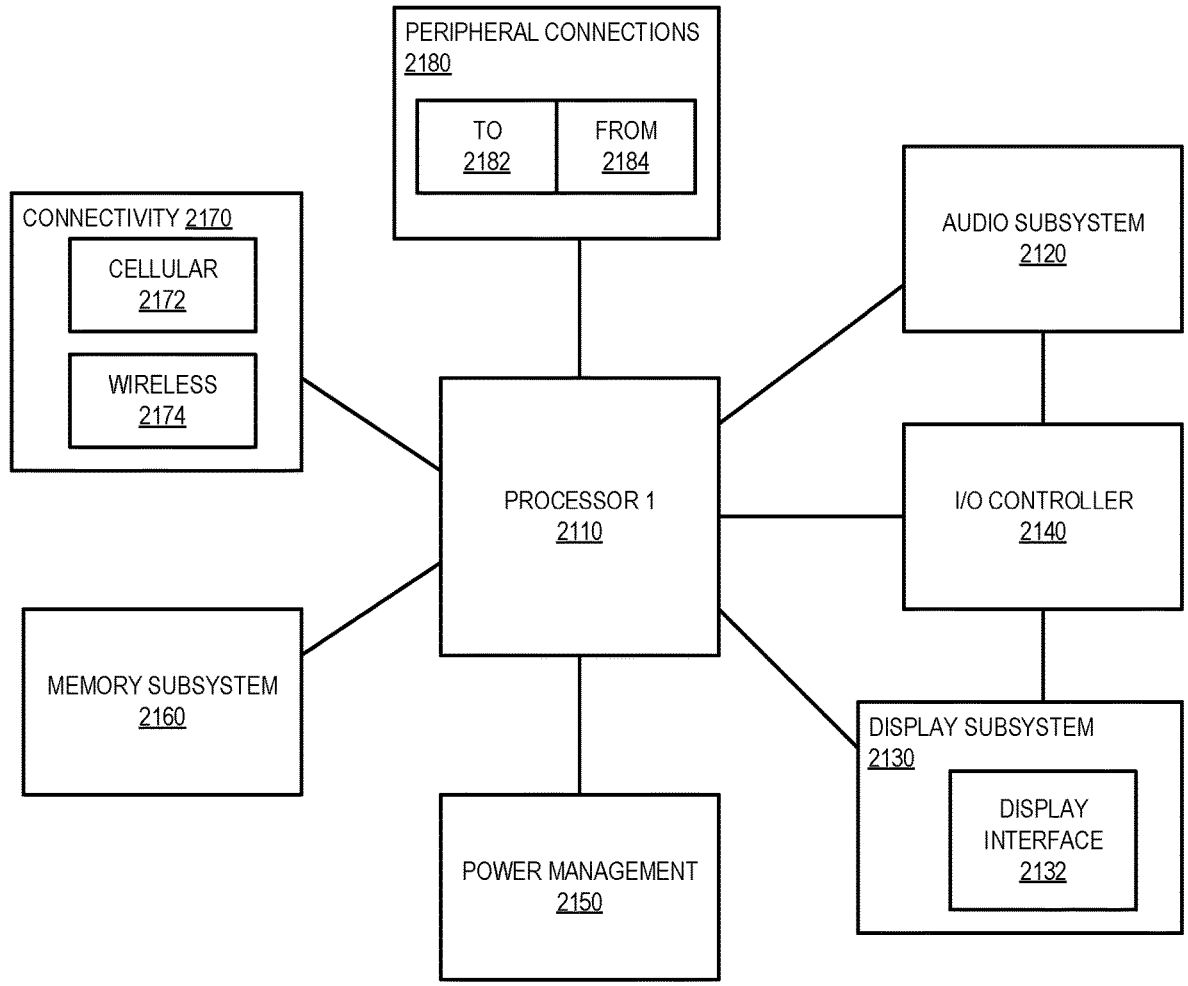
FIG. 6 illustrates a smart device or a computer system or a SoC (System-on-Chip) which is packaged in the cavity formed according to some embodiments.

FIG. 6 illustrates a smart device or a computer system or a SoC (System-on-Chip) 2100 (e.g., processor die 104) which is packaged in a cavity (e.g., cavity 109, 313) formed according to some embodiments. It is pointed out that those elements of FIG. 6 having the same reference numbers (or names) as the elements of any other figure can operate or function in any manner similar to that described, but are not limited to such.

FIG. 6 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions. The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a cavity made in a substrate of a printed circuit board (PCB); a plurality of solder balls embedded in the cavity; and a horizontal trace within the substrate, wherein the horizontal trace is partially directly under the plurality of solder balls and is coupled to the plurality of solder balls and another trace or via in the substrate such that a substrate region under the plurality of solder balls is independent of a stop layer under the cavity. In some embodiments, the apparatus comprises a vertical trace within the substrate, wherein the vertical trace is under the cavity and is coupled to the plurality of solder balls. In some embodiments, the apparatus comprises a processor die embedded in the cavity and electrically coupled to the horizontal and vertical traces via the plurality of solder balls. In some embodiments, the apparatus comprises: a patch with high density routing embedded in the cavity, wherein the patch is electrically coupled to the horizontal and vertical traces via the plurality of solder balls. In some embodiments, the patch comprises an active device. In some embodiments, the patch comprises a passive device. In some embodiments, the apparatus comprises an embedded trace disposed on a first level interconnect (FLI) of the PCB.

In another example, a method is provided which comprises: depositing a metal trace layer over a carrier layer, wherein the metal trace layer is formed of a material having a higher etch selectivity against copper; printing a release layer over the metal trace, wherein the release layer has a dimension of a to-be formed cavity; depositing a photoresist material over the release layer and the metal trace; and patterning embedded traces in the photoresist material over the metal trace layer. In some embodiments, the metal trace layer comprises a material selected from a group consisting of: Ni and Sn. In some embodiments, the carrier layer comprises a material selected from a group consisting of: stainless steel and glass.

In some embodiments, the method comprises: electroplating copper over the patterned embedded traces; stripping off the photoresist material; depositing a dielectric layer over the electroplated copper; drilling one or more holes through the dielectric layer to expose at least a region of the electroplated copper; and applying copper on sidewalls of the one or more holes. In some embodiments, wherein the dielectric layer comprises epoxy. In some embodiments, the method comprises: patterning the photoresist material over the dielectric layer such that the photoresist material is above the release layer; electroplating copper in the one or more holes and in regions of the patterned photoresist material; stripping off the photoresist material; laser trimming a cavity boundary such that the laser trimming stops at the metal trace layer; and removing the dielectric layer within the cavity boundary to form the cavity.

In some embodiments, the method comprises: depositing the material, having higher etch selectivity against copper, in the cavity; over-plating the material above the cavity; grinding the over-plated material; depositing a layer of copper over the grinded over-plated material; patterning a photoresist material over the layer of copper; depositing copper in regions of the patterned photoresist material; stripping off the photoresist material; and seed etching some regions of the deposited layer copper. In some embodiments, the method comprises: filling with copper one or more holes of the patterned photoresist material; forming a via filled with copper over the cavity region; etching the material from the cavity, the material having higher etch selectivity against copper; forming a horizontal trace between the via filled with copper over the cavity region and with a via formed away from the cavity; depositing solder resist material around the cavity; and forming regions for solder balls after removing the solder resist material. In some embodiments, the method comprises: embedding a processor die in the cavity and coupling it with solder balls formed in the regions for solder balls. In some embodiments, the method comprises: embedding a patch in the cavity, the patch having higher density routing than density of routings outside the cavity. In some embodiments, the patch includes active and/or passive devices.

In another example, a system is provided which comprises: a memory; a processor die coupled to the memory; a cavity made in a substrate of a printed circuit board (PCB); a plurality of solder balls embedded in the cavity; a vertical trace within the substrate, wherein the vertical trace is under the cavity and is coupled to the plurality of solder balls; a horizontal trace within the substrate, wherein the horizontal trace is partially directly under the plurality of solder balls and is coupled to the plurality of solder balls and another trace or via in the substrate such that a substrate region under the plurality of solder balls is independent of a stop layer under the cavity, and wherein the processor die is coupled to the horizontal and vertical traces via the plurality of solder balls; and a wireless interface for allowing the processor to communicate with another device. In some embodiments, the system comprises an embedded trace disposed on a first level interconnect of the PCB. In some embodiments, the system comprises an embedded trace disposed in the cavity. In some embodiments, the system comprises a patch with high density routing embedded in the cavity, wherein the patch is electrically coupled to the horizontal and vertical traces via the plurality of solder balls. In some embodiments, the patch comprises an active device. In some embodiments, the patch comprises a passive device.

In another example, a system is provided which comprises: a printed circuit board (PCB); a memory on the PCB; a cavity made in a substrate of the PCB; a plurality of solder balls embedded in the cavity; a horizontal trace within the substrate, wherein the horizontal trace is partially directly under the plurality of solder balls and is coupled to the plurality of solder balls and another trace or via in the substrate such that a substrate region under the plurality of solder balls is independent of a stop layer under the cavity; and a wireless interface on the PCB. In some embodiments, the system comprises: a vertical trace within the substrate, wherein the vertical trace is under the cavity and is coupled to the plurality of solder balls; and a processor die embedded in the cavity and electrically coupled to the horizontal and vertical traces via the plurality of solder balls.

In some embodiments, the system comprises an embedded trace disposed on a first level interconnect of the PCB. In some embodiments, the system comprises an embedded trace disposed in the cavity. In some embodiments, the system comprises a patch with high density routing embedded in the cavity, wherein the patch is electrically coupled to the horizontal and vertical traces via the plurality of solder balls. In some embodiments, the patch comprises an active device. In some embodiments, the patch comprises a passive device.

In another example, an apparatus sis provided which comprises: means for depositing a metal trace layer over a carrier layer, wherein the metal trace layer is formed of a material having a higher etch selectivity against copper; means for printing a release layer over the metal trace, wherein the release layer has a dimension of a to-be formed cavity; means for depositing a photoresist material over the release layer and the metal trace; and means for patterning embedded traces in the photoresist material over the metal trace layer. In some embodiments, the metal trace layer comprises a material selected from a group consisting of: Ni and Sn. In some embodiments, the carrier layer comprises a material selected from a group consisting of: stainless steel and glass. In some embodiments, the apparatus comprises: means for electroplating copper over the patterned embedded traces; means for stripping off the photoresist material; means for depositing a dielectric layer over the electroplated copper; means for drilling one or more holes through the dielectric layer to expose at least a region of the electroplated copper; and means for applying copper on sidewalls of the one or more holes.

In some embodiments, the dielectric layer comprises epoxy. In some embodiments, the apparatus comprises: means for patterning the photoresist material over the dielectric layer such that the photoresist material is above the release layer; means for electroplating copper in the one or more holes and in regions of the patterned photoresist material; means for stripping off the photoresist material; means for laser trimming a cavity boundary such that the laser trimming stops at the metal trace layer; and means for removing the dielectric layer within the cavity boundary to form the cavity. In some embodiments, the apparatus comprises: means for depositing the material, having higher etch selectivity against copper, in the cavity; means for overplating the material above the cavity; means for grinding the over-plated material; means for depositing a layer of copper over the grinded over-plated material; means for patterning a photoresist material over the layer of copper; means for depositing copper in regions of the patterned photoresist material; means for stripping off the photoresist material; and means for seed etching some regions of the deposited layer copper.

In some embodiments, the apparatus comprises: means for filling with copper one or more holes of the patterned photoresist material; means for forming a via filled with copper over the cavity region; means for etching the material from the cavity, the material having higher etch selectivity against copper; means for forming a horizontal trace between the via filled with copper over the cavity region and with a via formed away from the cavity; means for depositing solder resist material around the cavity; and means for forming regions for solder balls after removing the solder resist material. In some embodiments, the apparatus comprises: embedding a processor die in the cavity and coupling it with solder balls formed in the regions for solder balls. In some embodiments, the apparatus comprises: means for embedding a patch in the cavity, the patch having higher density routing than density of routings outside the cavity. In some embodiments, the patch includes active and/or passive devices.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A method comprising:
   depositing a metal trace layer over a carrier layer, wherein the metal trace layer is formed of a material having a higher etch selectivity against copper;
   printing a release layer over the metal trace, wherein the release layer has a dimension of a to-be formed cavity;
   depositing a photoresist material over the release layer and the metal trace; and
   patterning embedded traces in the photoresist material over the metal trace layer.

2. The method of claim 1, wherein the metal trace layer comprises a material selected from a group consisting of: Ni and Sn.

3. The method of claim 1, wherein the carrier layer comprises a material selected from a group consisting of: stainless steel and glass.

4. The method of claim 1, comprising:
   electroplating copper over the patterned embedded traces;
   stripping off the photoresist material;
   depositing a dielectric layer over the electroplated copper;
   drilling one or more holes through the dielectric layer to expose at least a region of the electroplated copper; and
   applying copper on sidewalls of the one or more holes.

5. The method of claim 4, wherein the dielectric layer comprises epoxy.

6. The method of claim 4, comprising:
   patterning the photoresist material over the dielectric layer such that the photoresist material is above the release layer;
   electroplating copper in the one or more holes and in regions of the patterned photoresist material;
   stripping off the photoresist material;
   laser trimming a cavity boundary such that the laser trimming stops at the metal trace layer; and
   removing the dielectric layer within the cavity boundary to form the cavity.

7. The method of claim 6, comprising:
   depositing the material, having higher etch selectivity against copper, in the cavity;
   over-plating the material above the cavity;
   grinding the over-plated material;
   depositing a layer of copper over the grinded over-plated material;
   patterning a photoresist material over the layer of copper;
   depositing copper in regions of the patterned photoresist material;
   stripping off the photoresist material; and
   seed etching some regions of the deposited layer copper.

8. The method of claim 7, comprising:
   filling with copper one or more holes of the patterned photoresist material;
   forming a via filled with copper over the cavity region;
   etching the material from the cavity, the material having higher etch selectivity against copper;
   forming a horizontal trace between the via filled with copper over the cavity region and with a via formed away from the cavity;
   depositing solder resist material around the cavity; and
   forming regions for solder balls after removing the solder resist material.

9. The method of claim 8, comprising embedding a processor die in the cavity and coupling it with solder balls formed in the regions for solder balls.

10. The method of claim 8, comprising embedding a patch in the cavity, the patch having higher density routing than density of routings outside the cavity.

11. The method of claim 10, wherein the patch includes active and/or passive devices.

* * * * *